(12) United States Patent
Kirby et al.

(10) Patent No.: US 7,101,792 B2
(45) Date of Patent: Sep. 5, 2006

(54) METHODS OF PLATING VIA INTERCONNECTS

(75) Inventors: Kyle K. Kirby, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/682,703

(22) Filed: Oct. 9, 2003

(65) Prior Publication Data

US 2005/0077630 A1 Apr. 14, 2005

(51) Int. Cl.
*H01L 21/44* (2006.01)

(52) U.S. Cl. .................. 438/666; 438/667; 438/675; 438/928

(58) Field of Classification Search ................ 438/666, 438/667, 668, 675, 598, 928
See application file for complete search history.

(56) References Cited

U.S. PATENT DOCUMENTS

| | | | |
|---|---|---|---|
| 4,692,349 A | | 9/1987 | Georgiou et al. |
| 4,808,273 A | * | 2/1989 | Hua et al. ................. 205/123 |
| 4,978,639 A | | 12/1990 | Hua et al. |
| 5,674,787 A | | 10/1997 | Zhao et al. |
| 5,897,368 A | | 4/1999 | Cole, Jr. et al. |
| 6,032,527 A | * | 3/2000 | Genova et al. .......... 73/204.26 |
| 6,169,024 B1 | | 1/2001 | Hussein |
| 6,197,664 B1 | | 3/2001 | Lee et al. |
| 6,242,935 B1 | * | 6/2001 | Akram ..................... 324/765 |
| 6,255,126 B1 | * | 7/2001 | Mathieu et al. ................ 438/15 |
| 6,277,669 B1 | * | 8/2001 | Kung et al. .................. 438/106 |
| 6,291,332 B1 | | 9/2001 | Yu et al. |
| 6,384,481 B1 | | 5/2002 | Hussein et al. |
| 6,406,939 B1 | | 6/2002 | Lin |
| 6,418,616 B1 | | 7/2002 | Bhatt et al. |
| 6,448,644 B1 | | 9/2002 | Lin |
| 6,468,889 B1 | * | 10/2002 | Iacoponi et al. ............ 438/597 |
| 6,562,709 B1 | | 5/2003 | Lin |
| 6,565,729 B1 | | 5/2003 | Chen et al. |
| 2003/0057097 A1 | * | 3/2003 | Tsai et al. .................... 205/102 |

OTHER PUBLICATIONS

U.S. Appl. No. 10/379,890, filed Mar. 5, 2003, for "Conductive Through Wafer Vias".

* cited by examiner

*Primary Examiner*—Trung Dang
(74) *Attorney, Agent, or Firm*—TraskBritt

(57) ABSTRACT

Methods for filling high aspect ratio vias with conductive material. At least one high aspect ratio via is formed in the backside of a semiconductor substrate. The at least one via is closed at one end by a conductive element forming a conductive structure of the semiconductor substrate. The backside of the semiconductor substrate is exposed to an electroplating solution containing a conductive material in solution with the active surface semiconductor substrate isolated thereform. An electric potential is applied across the conductive element through the electroplating solution and a conductive contact pad in direct or indirect electrical communication with the conductive element at the closed end of the at least one via (or forming such conductive element) to cause conductive material to electrochemically deposit from the electroplating solution and fill the at least one via. Semiconductor devices and in-process semiconductor devices are also disclosed.

38 Claims, 4 Drawing Sheets

METHODS OF PLATING VIA INTERCONNECTS

BACKGROUND OF THE INVENTION

1. Field of the Invention

The present invention relates generally to the field of integrated circuits formed on a semiconductor substrate, such as a silicon wafer or die, including vias formed therethrough and, more particularly although not necessarily limited to, semiconductor substrates that include through-vias filled with conductive material and methods for their fabrication.

2. State of the Art

In order to function, integrated circuits must be in electrical communication with signal inputs and outputs as well as power and ground or bias connections external to the integrated circuit. For example, power and ground or other reference voltage must be supplied for operation of the integrated circuit, and other connections, such as for input, output and timing signals, may also be required. These connections are typically made through leads or other conductive elements connected to bond pads present on the active surface of a semiconductor die.

As electronic devices have become smaller and more sophisticated, the challenge of expanding capabilities while minimizing the space, or "real estate," used by an integrated circuit has continued to increase. Techniques for reducing the space required by a semiconductor die or chip include the use of a redistribution layer (RDL) as an additional level of wiring to reposition bond pads providing inputs and outputs for a semiconductor die from the perimeter or along the centerline to alternative locations, for example, to define an array of locations for flip-chip attachment to a substrate. Use of bond pad redistribution may be necessary if perimeter or central bond pads have to be rerouted into another I/O layout. For example, if perimeter or central bond pad pitch (spacing) is too fine or is otherwise unsuitable for connection to the terminal pad layout of a carrier substrate, repositioning may be required.

Where present, the traces of an RDL may be embedded into a dielectric material. Suitable dielectric materials may include benzocyclobutene (BCB), polyimide, and photosensitive dielectrics. The process steps depend on whether the redistribution traces are aluminum or copper. For aluminum traces, the aluminum is sputtered onto the wafer surface and the traces are etched using a photolithography-defined etch mask pattern comprising a resist. In the case of copper traces, the metal is electroplated onto the wafer surface and then selectively etched to form traces. A redistribution layer is typically applied on the active surface of a semiconductor die to enable flips chip mounting of the resulting "chip-scale" package on a carrier substrate such as an interposer or a printed circuit board.

Another technique for reducing the real estate required on a carrier substrate is the use of stacked semiconductor chips in a single package. In stacked chip-scale packages, two or more semiconductor chips will be mounted in a stack and electrically interconnected to a carrier substrate and/or to one another. This reduces the space taken on the underlying carrier substrate in comparison to mounting separate chips directly to the substrate.

Stacked chip-scale packages may require vias to be formed through the entire thickness of a semiconductor die between the active surface and backside thereof, allowing electrical connection therethrough to one or more dice stacked thereon. Such vias may require high aspect ratios (the ratio of via depth to diameter) due to the limited available area for positioning the vias in the semiconductor die, making them difficult to fill with electrically conductive material. Electroless plating of vias with a conductive material typically requires the placement of a seed layer of conductive material, such as copper or aluminum, in the via. Typically, this is accomplished by a sputtering or chemical vapor deposition ("CVD") process, which can experience difficulty in depositing the conductive material on the bottom of a relatively high aspect via, for example, 0:1 or greater. Such high aspect ratios via may even have aspects of 15:1 or greater. Where a portion of the seed layer is deposited on the side of a high aspect ratio via, the material depositing during filling can fill across the via above the bottom, funneling or bridging off the underlying portion of the via. Other techniques, such as depositing conductive material over the surface of the wafer to fill the vias can similarly lead to the funneling or bridging off of a high aspect ratio via near the top of the via. Conventional electroplating typically requires the via to be open on both ends to enable a conductive contact plate to be placed on one side of the wafer to cover the bottom of the via and the electroplating solution to enter the via from the other side. This technique thus may limit the placement or order of the via fill in the wafer fabrication process. Some electroplating techniques also may require placement of a seed layer, resulting in similar funneling or bridging off problems. For example, a relatively new process employs metal organic chemical vapor deposition (MOCVD) to place a copper seed layer prior to electroplating of copper in the via. In addition to the extra step required to place the seed layer, there are reliability issues with this approach.

Accordingly, a method or system for effectively filling high aspect ratio vias without the need for placing a seed layer would be an improvement in the art. Such a technique that might be used for filling blind (or closed end) vias would constitute a further improvement in the art.

BRIEF SUMMARY OF THE INVENTION

The present invention, in several embodiments, includes methods for filling high aspect ratio vias with conductive material to enable electrical communication therethrough. At least one high aspect ratio via is formed in the backside of a semiconductor substrate. The at least one via may be closed at one end by a conductive element, forming a conductive structure of the semiconductor substrate. The backside of the semiconductor substrate may be exposed to an electroplating solution containing a conductive material in solution with the active surface isolated therefrom. An electric potential is applied across the conductive element by applying an electric current either directly through the conductive element at the closed end of the at least one via or through one or more other conductive structures of the semiconductor substrate electrically connected to the conductive element exposed at the bottom of the at least one via. The conductive material electrochemically deposits from the electroplating solution in response to the current flow, adhering to the exposed portion of the conductive element and filling the at least one via with conductive material.

Embodiments of semiconductor devices and in-process semiconductor devices fabricated in accordance with the methods of the present invention are also encompassed by the invention.

BRIEF DESCRIPTION OF THE DRAWINGS

In the drawings, which, in conjunction with the accompanying text, discloses the best mode presently known to the inventors for carrying out the present invention.

DETAILED DESCRIPTION OF THE ILLUSTRATED EMBODIMENTS

The present invention provides methods for filling vias in semiconductor substrates, as well as semiconductor substrates having filled vias created by those methods. It will be appreciated by those of ordinary skill in the art that the embodiments herein described, while illustrating certain specific and exemplary implementations of the invention, do not limit the invention or the scope of the appended claims. Those of ordinary skill in the art will also understand that various combinations or modifications of the disclosed embodiments may be made without departing from the scope of the invention.

Figure 1:
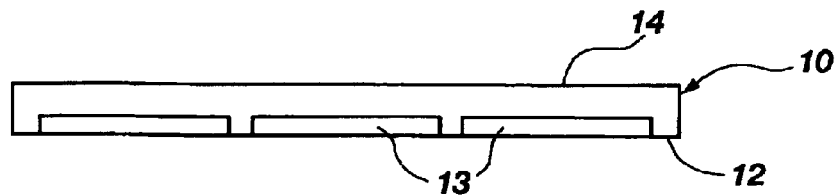
FIG. 1 is a side view of a semiconductor substrate useful in practicing methods in accordance with the present invention.

FIG. 1 depicts a semiconductor substrate 10. The semiconductor substrate 10 may comprise primarily silicon, as formed in the art by growing a single crystal in the form of a cylinder, which is then segmented or sliced transversely to form a plurality of wafers. Alternatively, the semiconductor substrate 10 includes an active surface 12 and a backside 14 and may comprise a bulk semiconductor substrate comprising a layer of semiconductor material, such as a silicon on sapphire (SOS) substrate, a silicon on glass (SOG) substrate, or other type of silicon on insulator (SOI) substrate. The active surface 12 of the semiconductor substrate may be doped as shown schematically at 13, in accordance with techniques well known in the art. For example, a P-type substrate may be used. It will be appreciated that other suitable semiconductor substrates may be used, such as N-type substrates or even nonsilicon semiconducting substrates such as those of gallium arsenide or indium phosphide, where appropriate electrophoretic and chemical reactions may be designed. All such alternative structures are within the scope of the present invention.

Figure 2:
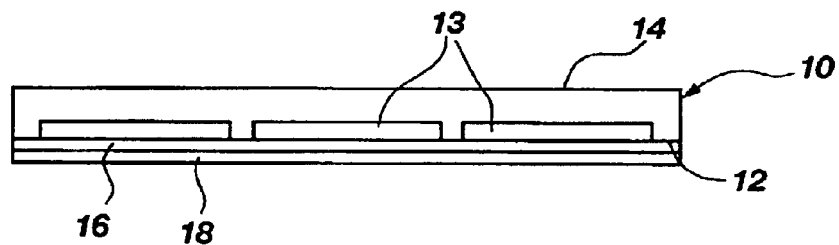
FIG. 2 is a side view of the semiconductor substrate of FIG. 1, including additional layers of material applied thereto, useful in practicing some embodiments of the present invention.

FIG. 2 shows the semiconductor substrate 10 of FIG. 1 with a dielectric layer 16 and conductive layer 18 disposed on the active surface 12 thereof. The dielectric layer 16 may be an interlayer dielectric and may be formed of any suitable dielectric material, such as BCB, polyimide, a photosensitive dielectric, or any other suitable dielectric or passivating material. Electrically conductive elements may be formed at desired via locations from conductive layer 18, as by blanket deposition and selective etching. Conductive layer 18 may, for example, be the same layer used to define bond pads for semiconductor substrate 10. Conductive layer 18 may comprise a metallic material and an elemental metal is currently preferred, although it will be appreciated that alternate conductive materials, such as alloys or even a conductive or conductor-filled polymeric material may be used.

Figure 3:
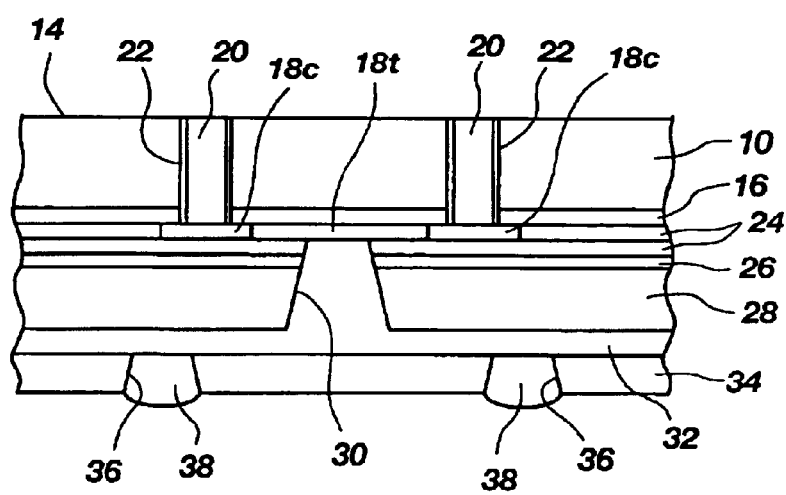
FIG. 3 is an enlarged side cross-sectional view of a portion of the semiconductor substrate of FIGS. 1 and 2 after a via has been created therein from the backside thereof.

Turning to FIG. 3, an enlarged portion of semiconductor substrate 10 is shown with exemplary vias 20 formed through the backside 14 thereof. As depicted, the vias 20 pass substantially entirely through the depth of the semiconductor substrate 10 and are closed at one end by conductive elements on active surface 12 in the form of contacts 18c connected by trace 18t formed, as by etching, from conductive layer 18. It will be appreciated that vias 20 which do not pass substantially entirely through the substrate 10 but merely penetrate to a selected depth therein may be created and used in methods in accordance with the present invention, so long as the end of each via 20 is covered with a contact 18c of conductive material in electrically communicative connection with a conductive structure on the active surface 12 of the semiconductor substrate 10, as will be discussed in further detail herein. It will be further appreciated that, although, for simplicity of understanding, only two vias 20 are depicted, the methods of the present invention may be, and in most instances would be, simultaneously conducted with a large plurality of vias 20 in a semiconductor substrate 10. It will also be appreciated by those of ordinary skill in the art that the methods of the present invention will typically be applied on a wafer or other bulk semiconductor substrate scale for efficiency, although the invention is not so limited.

Vias 20 may be formed after the application of the dielectric layer 16 and conductive contacts 18c, as depicted by the process of FIGS. 2 and 3, or may be created prior to the application of one or both of such layers to the active surface 12, as is desired for ease of processing steps. Vias 20 may be created in any suitable fashion. Vias 20 may be of round, polygonal or any other suitable cross-sectional shape and will typically be characterized by having a high aspect ratio. Such vias 20 may be formed by drilling, by laser ablation, or by any other suitable method known in the art. Laser ablation may be effected using any suitable equipment, such as the Model 5000-series lasers, offered currently by ElectroScientific Industries (ESI) of Portland, Oreg. One specific, suitable piece of equipment is a 355 nm wavelength UV YAG laser, ESI Model 2700, which may be used to form vias as little as 25 μm in diameter. One hundred pulses using this laser will form a 750 μm deep via through silicon. Another suitable laser is the Model 200, offered by Xsil Limited of Dublin, Ireland. If desired, a TMAH (tetramethyl ammonium hydroxide) solution may be used to clean the vias 20 after formation, which can result in a squared cross-section for the vias.

Alternatively, vias 20 maybe formed by etching the semiconductor substrate 10 with a suitable etchant. Where vias 20 are formed by etching, additional acts, including the, application and patterning of an etchant-resistive material such as a photoresist material to backside 14 of the semiconductor substrate 10, followed by etching with a suitable wet or dry etchant, maybe required. Any other suitable method for forming vias 20 in a semiconductor substrate 10 known now, or in the future, to those of ordinary skill in the art may be used and is within the scope of the present invention. Vias 20 may be of substantially round cross-section, or otherwise, as noted above. Currently, an anisotropic etch is preferred in forming vias 20 for practicing the methods of the present invention, although it will be appreciated that any suitable via-forming technology or procedure may be used.

Another nonlimiting example of a suitable technology for forming the vias 20 is the so-called atmospheric downstream plasma (ADP) process offered by Tru-Si Technologies, Inc. of Sunnyvale, Calif. As applied to via formation, the ADP process is implemented using an aluminum mask layer formed over a surface of a semiconductor substrate patterned with apertures to define via locations. An argon carrier gas is employed, with fluorine as the reactant gas. The etch effected is substantially isotropic. Once the vias 20 are created and, if necessary, cleaned, the contact 18c formed from conductive layer 18 is exposed at the bottoms thereof. Where necessary, the vias 20 may be cleaned using any suitable process to provide a clean and porous surface at the sidewalls of vias 20.

As depicted in FIG. 3, additional processing steps may be carried out on the semiconductor substrate 10 prior to filling of vias 20 with conductive material, such as the application of additional passivation or dielectric layers, or the formation of conductive traces for the RDL or through intervening layers, even to the formation of under bump metallization ("UBM") structures to facilitate formation of solder bumps thereon for flip-chip configuration of semiconductor dice singulated from the substrate 10. Where additional material layers are-present, the portions of conductive contacts 18c accessible through the vias 20 are in electrically conductive contact with a conductive structure on the exposed side (active surface 12 side) of the substrate, as through a UBM structure. Any additional steps or procedures needed to apply the additional layers, place or etch conductive traces, and form UBM structures maybe performed as desired to facilitate the processing of the semiconductor substrate 10. For example, and again with reference to FIG. 3, conductive contacts 18c may comprise pads or traces etched from a blanket layer of metal (conductive layer 18), as previously discussed, and extend under the bottoms of more than one via 20. One or more passivation layers 24 of, for example, tetraethyloxysilicate (TEOS), may be formed over and adjacent contacts 18c and trace 18t formed from conductive layer 18. Another passivation layer 26 of, for example, silicon nitride, may also be formed. Finally, a layer 28 of polybenzloxyazole ("PBO"), available from Sumitomo Plastics America, Inc. or of polyimide may be formed over the preceding layers. Layers 24, 26 and 28 may then be etched after masking with a photoresist and patterning to define the location of one or more contact vias 30. Contact vias 30 are then formed by etching, which may be by wet or dry, isotropic or anisotropic etch, as known in the art.

As described above, a blanket conductive layer 32 may be formed, for example, of copper or aluminum, over dielectric layer 28 as an RDL precursor layer. As further described above, blanket conductive layer 32 may then be etched to form traces 32t (FIG. 4B) of the redistribution layer. In either instance, blanket conductive layer 32 also fills contact vias 30.

Finally, and as depicted in FIG. 3, another dielectric layer 34 of, for example, polyimide may be formed over the redistribution layer traces 32t and apertures 36 etched therethrough at locations where discrete conductive elements at the new I/O locations provided by the RDL are to be placed. The apertures 36 at such locations maybe filled, for example, with nickel to provide a UBM structure 38 if a tin/lead solder is to be used to form solder balls as discrete conductive elements by reflow. Of course, discrete conductive elements in the form of balls, bumps, studs, columns or pillars may be formed from a wide variety of conductive materials.

Where desired, the vias 20 may be lined with a dielectric material prior to filling. This lining may provide protection from the effects of current flowing through the vias 20 during operation of the semiconductor substrate 10. For example, where the substrate 10 is silicon, the sidewalls of the vias 20 may be oxidized to provide an insulative coating of silicon dioxide. Alternatively, a dielectric material may be disposed on the sidewalls of the vias 20. Some examples of suitable dielectric materials include Parylene™, offered by Specialty Coating Systems of Indianapolis, Ind., and TEOS, although any suitable dielectric material may be used. Dielectric coating materials that may be applied through application into vias 20 as a vapor that condenses on the sidewalls thereof may be especially desirable. A dielectric lining 22 on the sidewalls of vias 20 is shown in FIG. 3.

Figure 4:
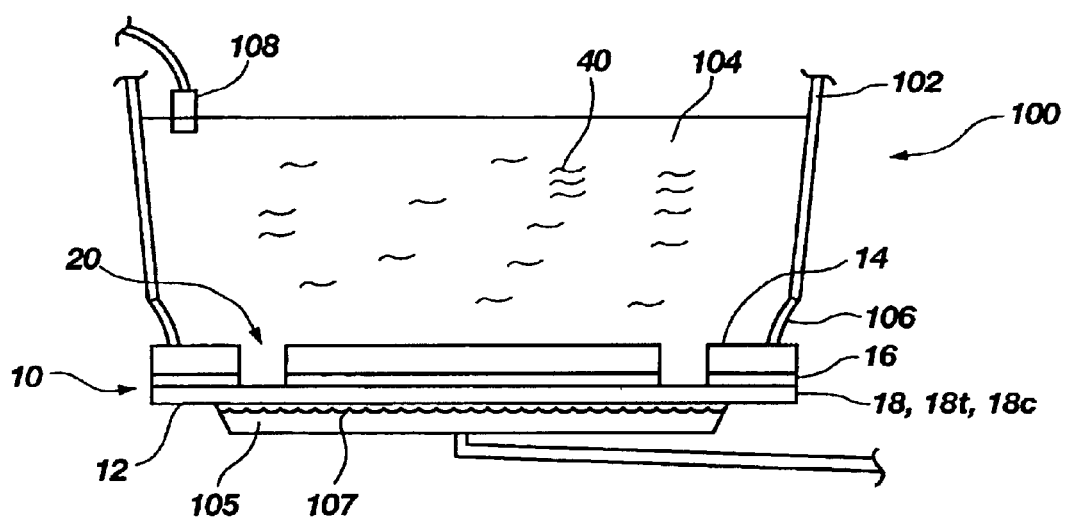
FIG. 4 is a side view of a representation of a semiconductor substrate undergoing deposition of conductive material in vias thereof from an electroplating solution with a conductive contact pad of an electroplating apparatus in contact with a conductive structure of the semiconductor substrate.

Turning to FIG. 4, the electrodeposition of a conductive material 40 in via 20 is illustrated in connection with an exemplary electroplating system 100. While electrochemical deposition may be accomplished using any conventional technique known now, or in the future, to those of ordinary skill in the art, the currently preferred system is depicted in order to fully disclose the principles of the present invention.

Backside 14 of the substrate 10, including vias 20, forms a surface (such as a bottom surface) of a reservoir 102 containing an electroplating solution 104. Electroplating solution 104 may be any suitable fluid with a conductive material 40 in solution or otherwise suspended therein, and the term "solution" as used herein encompasses any such fluid including conductive material. Any fluid suitable for dissolving or otherwise suspending a conductive material 40 such as a metal therein and allowing the conductive material 40 to be electrochemically deposited therefrom may be used.

The active surface 12 of substrate 10 remains outside the reservoir and is not exposed to the electroplating solution. Where present, UBM structures 38, additional passivating layers, conductive traces and/or a metal layer as well as integrated circuitry present on active surface 12 are thus isolated from the electroplating solution 104. This removes the need for additional protection, such as coating structures on the active surface 12 with a protective or nonconductive material to prevent deposition or interaction with a potentially caustic solution. A seal may be formed around an edge of the substrate 10 by a sealing member 106, which may comprise an O-ring, a flexible elastomer face seal, a wiper-type seal or another suitable seal configuration. Where desirable, the pressure in the reservoir 102 may be reduced relative to that outside the reservoir to assist the seal formation and maintenance. In other embodiments, the substrate 10 may be temporarily attached to the reservoir 102 with a suitable adhesive sealing compound to form the sealing member 106.

Figure 4A:
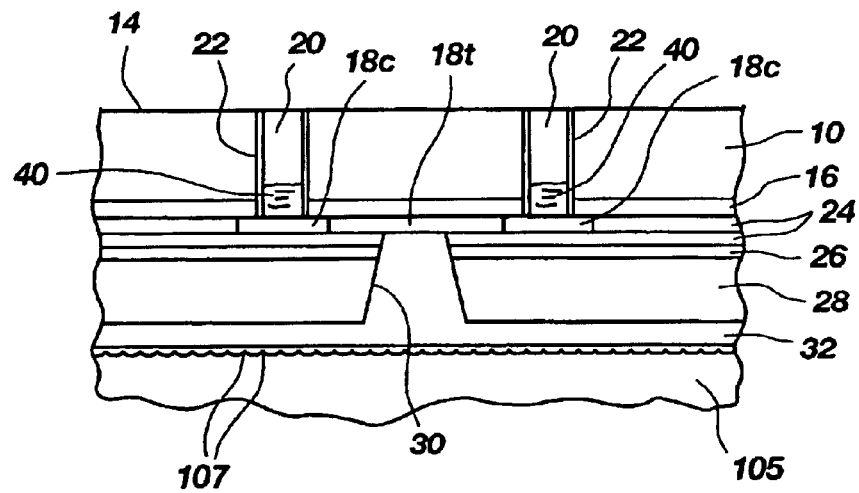
FIG. 4A is an enlarged side cross-sectional view of an area of contact between a conductive contact pad of an electroplating apparatus and another conductive structure of a semiconductor substrate.
Figure 4B:
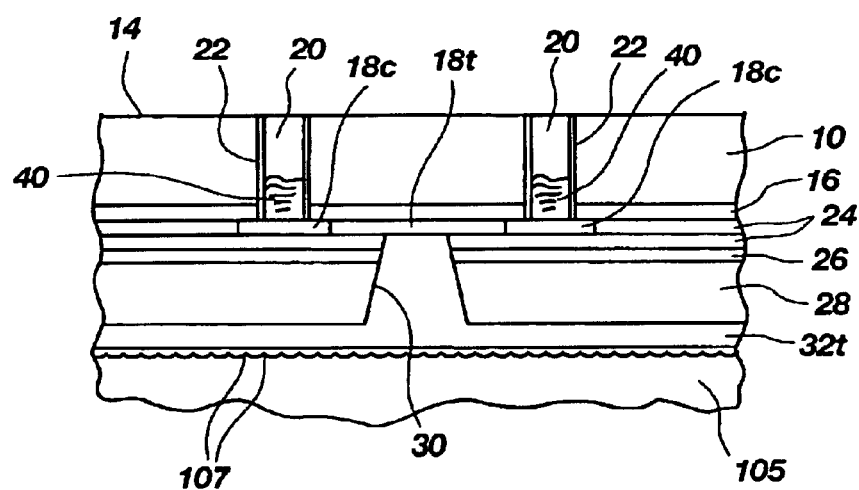
FIG. 4B is an enlarged side cross-sectional view of an area of contact between a conductive contact pad of an electroplating apparatus and yet another conductive structure of a semiconductor substrate.
Figure 4C:
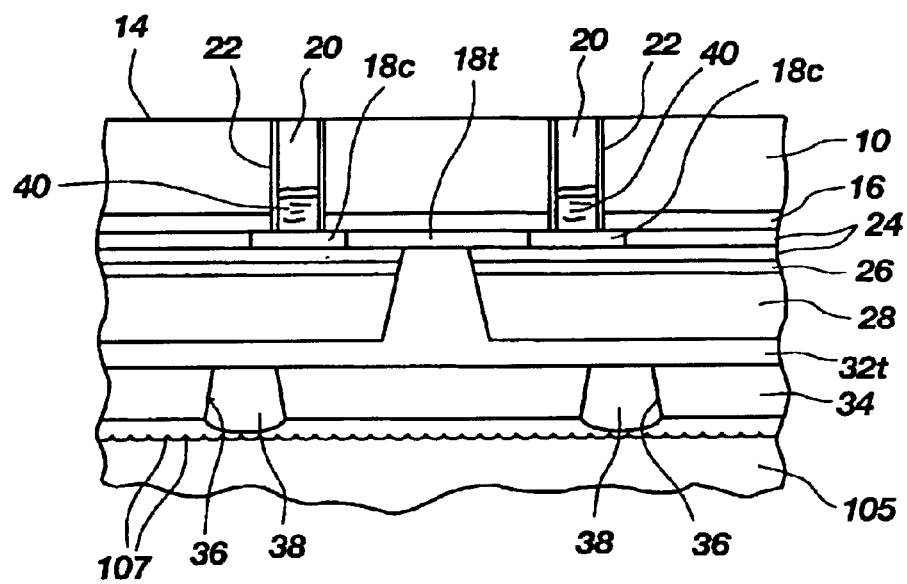
FIG. 4C is an enlarged side cross-sectional view of an area of contact between a conductive contact pad of an electroplating apparatus and still another conductive structure of a semiconductor substrate.

A conductive contact pad 105 may be placed adjacent the active surface 12 of semiconductor substrate 10. The conductive contact pad 105 maybe a conductive plate, such as a steel plate or another substrate bearing a conductive layer, that contacts an exposed conductive element on the active surface 12. It will be appreciated that the conductive contact pad 105 may include one or more conductive elements of any desired shape in contact with a conductive structure on the active surface 12 of the semiconductor substrate 10. As depicted schematically in FIG. 4A, conductive layer 18 or traces 18t and contact pads 18c may be placed in contact with conductive contact pad 105. As another example, a blanket conductive layer 32 comprising an RDL precursor is illustrated in contact with the conductive contact pad 105 in FIG. 4A, while FIG. 4B depicts a conductive contact pad 105 in contact with traces 32t of a redistribution layer and FIG. 4C depicts a conductive contact pad 105 in contact with an exposed UBM structure 38.

Currently, a contact pad having an irregular, or "furry," surface is preferred as it has an increased surface area for making electrical contact, although any suitable contact may be used. A conductive polymeric material, such as a conductive or conductor-filled polymer, for example, an anisotropically conductive z-axis polymer, maybe used to form the conductive contact pad 105. It is desirable that the conductive contact pad 105 or portions thereof may be somewhat yieldable under physical pressure so as to be able to at least conform to any irregularities in the topography of active surface 12 of substrate 10. For example, a conductive contact pad 105 having a surface with a number of conductive probe elements 107, such as a conductive plate with a number of probe elements extending in the form of conductive or conductor-coated whiskers or a contact structure having a deformable polymeric surface bearing conductive elements, may be used. Such a conductive contact pad 105 may have an improved ability to make electrically communicative contact with an exposed conductive surface, such as a UBM structure 38, an exposed blanket conductive layer 32 or redistribution layer traces 32t. The ability to use any of these conductive structures that form a part of the substrate 10 adds an additional degree of flexibility to the processing of the substrate 10.

Figure 5:
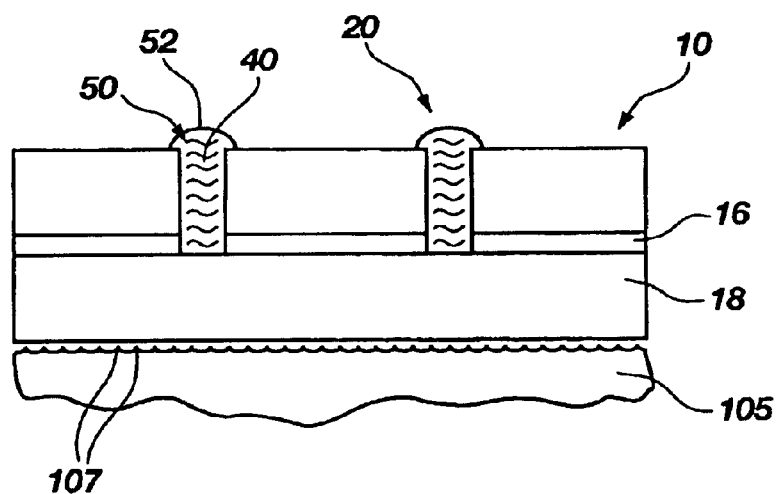
FIG. 5 is a side view of a semiconductor substrate having vias filled with a conductive material in accordance with the present invention.

Following any further desired, or required, preparations, the conductive material 40 may be electrochemically deposited in the vias 20. For example, where appropriate, copper may be used as the conductive material 40 in a copper sulfate electroplating solution 104. Current is applied through the solution (as through anode 108 immersed in electroplating solution 104) and conductive layer 18, contacts 18c and trace 18t, blanket conductive layer 32, or redistribution layer traces 32t in electrical communication with contacts 18c at the bottoms of vias 20, either-in-direct communication with conductive contact pad 105 or through additional conductive structures (UBM structures 38) of substrate 10 in electrical communication therewith, to electrochemically deposit the copper from the electroplating solution 104 onto the exposed portion of the conductive contact 18c at the bottom of each via 20. The deposition process continues until the vias 20 are filled, creating conductive studs 50 therethrough as depicted in FIG. 5 with respect to an embodiment wherein conductive layer 18 is used for contact with conductive contact pad 105. The surface 52 of the conductive stud 50 may be used as a contact pad to enable electrical communication with, for example, another semiconductor substrate to be stacked on semiconductor substrate 10.

Any other suitable conductive material 40 may be deposited as described above by adapting known electrochemical protocols. For example, aluminum, nickel, gold, silver or any other metal may be electroplated from an appropriate metal salt solution.

The backside 14, or any other exposed surface of semiconductor substrate 10, may be nonconductive or provided with a nonconductive coating, and will not be deposited upon as the conductive material 40 will only be deposited on conductive contacts 18c. The deposition of conductive material 40 can thus be selective for the vias 20 only.

Once the conductive stud 50 is created, the conductive contact pad 105 is removed from the semiconductor substrate 10. The reservoir 102 may be drained or rotated, or otherwise moved to remove the substrate 10 from contact with the electroplating solution 104. The semiconductor substrate 10 may then undergo additional processing, including singulation to form semiconductor dice therefrom. The individual semiconductor dice may be used in semiconductor assemblies including two or more stacked dice with electrical communication between dice in the stack occurring through the conductively filled vias 20.

Methods in accordance with the teachings of the present invention for forming conductive filled vias may be integrated into existing processes for manufacturing integrated circuits in any suitable fashion. Conductive filling of vias 20 may be conducted at any stage where the conductive contact pad 105 may be placed in electrical communication with a conductive contact 18c, either directly or through other conductive structures of the substrate 10 in electrical communication therewith. For example, the vias 20 may be filled immediately after deposition of a conductive layer 18, prior to patterning to form conductive contacts 18c and other structures such as bond pads from the same metallization. Similarly, the via filling may be performed after blanket deposition of an RDL precursor blanket conductive layer 32 or after redistribution traces 32t are defined, by direct contact of conductive contact pad 105 with blanket conductive layer 32 or traces 32t. Further, conductive filling of vias 20 may be effected after formation of UBM structures 38 by conductive contact therewith by conductive contact pad 105. For example, the filled via 20 may be formed prior to completing formation of the integrated circuitry of the semiconductor substrate. Alternatively, a filled via 20 may be formed after the creation of circuitry, using laser ablation to form the via through any layers, including protective layers formed on a substrate. Various acts used to create a filled via may be performed in connection with other processes as well. All such modifications and integrations are within the scope of the present invention.

It will be understood and appreciated by those of ordinary skill in the art that the methods of the present invention facilitate a via fill process by elimination of any requirement for a seed layer and through use of a faster method than electroless plating. Further, the methods of the present invention fit into the natural, existing flow of the wafer fabrication sequence and employ existing tools and techniques. The methods of the present invention provide the capability of completely filling the entire cross-section of a high aspect ratio via without the risk of funneling. It is also notable that the methods of the present invention may be practiced without risk of damage to that somewhat delicate active surface of a wafer or other bulk semiconductor substrate, as the vias are filled from the backside of the wafer with the active surface in isolation from the electroplating solution.

The methods herein described may be varied considerably without departing from the scope of the invention. Features and elements from different embodiments may be combined and additions, deletions and modifications made to the embodiments described herein without departing from the scope of the invention, which is defined by the claims which follow, and equivalents thereof.

What is claimed:

1. A method of placing conductive material in at least one via in a semiconductor substrate, the method comprising:
   providing a semiconductor substrate including at least one via extending from a backside thereof to a conductive element forming a conductive structure of the semiconductor substrate;
   exposing the backside of the semiconductor substrate including the at least one via to an electroplating solution while contacting a conductive surface on an active surface of the semiconductor substrate in electrical communication with the conductive element with a conductive contact pad by using the backside of the semiconductor substrate as a portion of a surface of a reservoir containing the electroplating solution;
   contacting at least one seal to the backside of the semiconductor substrate to retain the electroplating solution in the reservoir; and
   applying an electrical potential across the conductive element between the electroplating solution and the conductive contact pad to cause conductive material from the electroplating solution to deposit within the at least one via.

2. The method of claim 1, wherein providing a semiconductor substrate including at least one via extending from a backside thereof to a conductive element forming a conductive structure of the semiconductor substrate comprises providing a semiconductor substrate containing the conductive element and creating the at least one via from the backside of the semiconductor substrate to the conductive element.

3. The method of claim 1, wherein providing a semiconductor substrate including at least one via extending from a backside thereof to a conductive element forming a conductive structure of the semiconductor substrate further comprises lining sidewalls of the at least one via with a dielectric material.

4. The method of claim 1, wherein providing a semiconductor substrate including at least one via extending from a backside thereof to a conductive element forming a conductive structure of the semiconductor substrate comprises providing a semiconductor substrate containing the at least one via therethrough and depositing a layer of conductive material across the active surface of the semiconductor substrate in communication with the at least one via.

5. A method of placing conductive material in at least one via in a semiconductor substrate, the method comprising:
   providing a semiconductor substrate including at least one via extending from a backside thereof to a conductive element forming a conductive structure of the semiconductor substrate;
   exposing the backside of the semiconductor substrate including the at least one via to an electroplating solution while contacting a conductive surface on an active surface of the semiconductor substrate in electrical communication with the conductive element with a conductive contact pad comprising using the backside of the semiconductor substrate as a portion of a surface of a reservoir containing the electroplating solution by forming a portion of a bottom of the reservoir from the backside of the semiconductor substrate; and
   applying an electrical potential across the conductive element between the electroplating solution and the conductive contact pad to cause conductive material from the electroplating solution to deposit within the at least one via.

6. The method of claim 1, wherein contacting at least one seal to the backside of the semiconductor substrate to retain the electroplating solution in the reservoir isolates the active surface of the semiconductor substrate from contact with the electroplating solution.

7. The method of claim 1, wherein contacting the conductive surface on the active surface of the semiconductor substrate with a conductive contact pad comprises contacting a contact pad exhibiting a furry surface to the active surface of the semiconductor substrate.

8. The method of claim 1, wherein contacting the conductive surface on the active surface of the semiconductor substrate with a conductive contact pad comprises directly contacting the conductive element with the conductive contact pad.

9. The method of claim 8, wherein directly contacting the conductive element with the conductive contact pad comprises contacting a blanket layer of conductive material.

10. The method of claim 8, wherein directly contacting the conductive element with the conductive contact pad comprises contacting a discrete conductive element.

11. The method of claim 1, wherein contacting the conductive surface on the active surface of the semiconductor substrate with a conductive contact pad comprises contacting a surface of another conductive structure in electrical communication with the conductive element with the conductive contact pad.

12. The method of claim 11, wherein contacting the surface of the another conductive structure with the conductive contact pad comprises contacting a blanket layer of conductive material.

13. The method of claim 12, wherein contacting the blanket layer of conductive material comprises contacting a redistribution layer precursor layer.

14. The method of claim 11, wherein contacting the surface of the another conductive structure comprises contacting a redistribution layer trace.

15. The A method of placing conductive material in at least one via in a semiconductor substrate, the method comprising:
   providing a semiconductor substrate including at least one via extending from a backside thereof to a conductive element forming a conductive structure of the semiconductor substrate;
   exposing the backside of the semiconductor substrate including the at least one via to an electroplating solution while contacting a conductive surface on an active surface of the semiconductor substrate in electrical communication with the conductive element with a conductive contact pad by contacting the a UBM structure in electrical communication with the conductive element with the conductive contact pad; and
   applying an electrical potential across the conductive element between the electroplating solution and the conductive contact pad to cause conductive material from the electroplating solution to deposit within the at least one via.

16. The method of claim 15, wherein contacting a UBM structure comprises contacting a UBM structure in electrical communication with a redistribution layer trace.

17. The method of claim 1, wherein applying an electrical potential across the conductive element between the electroplating solution and the conductive contact pad to cause conductive material from the electroplating solution to deposit within the at least one via further comprises forming a contact element at an end of the at least one via.

18. The method of claim 1, wherein providing a semiconductor substrate comprises providing a semiconductor wafer or other bulk semiconductor substrate including a plurality of semiconductor die locations defined thereon.

19. The method of claim 1, further including forming the at least one via through the semiconductor substrate by one of anisotropically etching the at least one via therethrough, isotropically etching the at least one via therethrough, or ablating the at least one via therethrough using a laser.

20. The method of claim 19, wherein forming the at least one via comprises forming at least one high aspect ratio via.

21. The method of claim 19, further including lining sidewalls of the at least one via with a dielectric material.

22. The method of claim 21, wherein lining sidewalls of the at least one via with a dielectric material comprises either depositing a dielectric material on the sidewalls or forming a dielectric material from conversion of semiconductor material of the semiconductor substrate forming the sidewalls to a dielectric material.

23. The method of claim 1, wherein causing the conductive material from the electroplating solution to deposit within the at least one via comprises causing one of copper, aluminum, nickel, gold and silver to deposit within the at least one via.

24. The method of claim 1, wherein causing conductive material from the electroplating solution to deposit within the at least one via comprises causing the conductive material to fill the at least one via.

25. The method of claim 1, wherein contacting at least one seal to the backside of the semiconductor substrate to retain the electroplating solution in the reservoir comprises contacting an O-ring, a flexible elastomer face seal, or a wiper-type seal to the backside of the semiconductor substrate.

26. The method of claim 5, wherein providing a semiconductor substrate including at least one via extending from a backside thereof to a conductive element forming a conductive structure of the semiconductor substrate comprises providing a semiconductor substrate containing the conductive element and creating the at least one via from the backside of the semiconductor substrate to the conductive element.

27. The method of claim 5, wherein providing a semiconductor substrate including at least one via extending from a backside thereof to a conductive element forming a conductive structure of the semiconductor substrate further comprises lining sidewalls of the at least one via with a dielectric material.

28. The method of claim 5, wherein providing a semiconductor substrate including at least one via extending from a backside thereof to a conductive element forming a conductive structure of the semiconductor substrate comprises providing a semiconductor substrate containing the at least one via therethrough and depositing a layer of conductive material across the active surface of the semiconductor substrate in communication with the at least one via.

29. The method of claim 5, wherein contacting the conductive surface on the active surface of the semiconductor substrate with a conductive contact pad comprises contacting a contact pad exhibiting a furry surface to the active surface of the semiconductor substrate.

30. The method of claim 5, wherein contacting the conductive surface on the active surface of the semiconductor substrate with a conductive contact pad comprises directly contacting the conductive element with the conductive contact pad.

31. The method of claim 30, wherein directly contacting the conductive element with the conductive contact pad comprises contacting a blanket layer of conductive material.

32. The method of claim 30, wherein directly contacting the conductive element with the conductive contact pad comprises contacting a discrete conductive element.

33. The method of claim 5, wherein contacting the conductive surface on the active surface of the semiconductor substrate with a conductive contact pad comprises contacting a surface of another conductive structure in electrical communication with the conductive element with the conductive contact pad.

34. The method of claim 5, wherein applying an electrical potential across the conductive element between the electroplating solution and the conductive contact pad to cause conductive material from the electroplating solution to deposit within the at least one via further comprises forming a contact element at an end of the at least one via.

35. The method of claim 5, wherein providing a semiconductor substrate comprises providing a semiconductor wafer or other bulk semiconductor substrate including a plurality of semiconductor die locations defined thereon.

36. The method of claim 5, further including forming the at least one via through the semiconductor substrate by one of anisotropically etching the at least one via therethrough, isotropically etching the at least one via therethrough, or ablating the at least one via therethrough using a laser.

37. The method of claim 5, wherein causing the conductive material from the electroplating solution to deposit within the at least one via comprises causing one of copper, aluminum, nickel, gold and silver to deposit within the at least one via.

38. The method of claim 5, wherein causing conductive material from the electroplating solution to deposit within the at least one via comprises causing the conductive material to fill the least one via.

* * * * *

UNITED STATES PATENT AND TRADEMARK OFFICE
CERTIFICATE OF CORRECTION

| | |
|---|---|
| PATENT NO. | : 7,101,792 B2 |
| APPLICATION NO. | : 10/682703 |
| DATED | : September 5, 2006 |
| INVENTOR(S) | : Kirby et al. |

It is certified that error appears in the above-identified patent and that said Letters Patent is hereby corrected as shown below:

On the title page, item (56), under "U.S. Patent Documents", in column 1, line 3, below "4,808,273 A" insert -- 4,954,313  9/1990  Lynch --.

On the title page, item (56), under "U.S. Patent Documents", in column 1, line 4, below "4,978,639 A" insert -- 5,245,751  9/1993  Locke et al.
5,262,718   11/1993   Svendsen et al.
5,285,352   2/1994    Pastore et al.
5,421,083   6/1995    Suppelsa et al.
5,682,062   10/1997   Gaul --.

On the title page, item (56), under "U.S. Patent Documents", in column 1, line 9, below "6,197,664 B1" insert -- 6,228,754   5/2001   Iacoponi et al.
6,235,624 B1   5/2001   Sasaki et al. --.

On the title page, item (56), under "U.S. Patent Documents", in column 2, line 6, after "6,418,616" delete "B1" and insert -- B2 --, therefor.

On the title page, item (56), under "U.S. Patent Documents", in column 2, line 9, below "6,468,889 B1" insert -- 6,479,382 B1   11/2002   Naem --.

On the title page, item (56), under "U.S. Patent Documents", in column 2, line 11, below "6,565,729 B1" insert -- 6,620,731 B1   9/2003   Farnworth et al.
2002/0115290 A1   8/2002   Halahan et al. --.

On the title page, item (56), under "U.S. Patent Documents", in column 2, line 11, below "2003/0057097" insert -- 2003/0082356 A1   5/2003   Suemasu et al.
     FOREIGN PATENT DOCUMENTS
       EP  0 907 206 A1   4/1999
       JP   11-251316   9/1999 --.

UNITED STATES PATENT AND TRADEMARK OFFICE
CERTIFICATE OF CORRECTION

PATENT NO. : 7,101,792 B2
APPLICATION NO. : 10/682703
DATED : September 5, 2006
INVENTOR(S) : Kirby et al.

It is certified that error appears in the above-identified patent and that said Letters Patent is hereby corrected as shown below:

On the title page, item (56), under "Other Publications", in column 2, line 3, below "Through Wafer Vias"." insert -- International Search Report, Dated 12 April 2005, 7 Pages. Written Opinion of the International Searching Authority, dated 12 April 2005, 9 pages. --.

On the title page, item (57), under "Abstract", in column 2, line 9, delete "thereform." and insert -- therefrom. --, therefor.

In column 10, line 37, in Claim 15, delete "The" before "A".

In column 10, line 49, in Claim 15, delete "the" before "a".

In column 12, line 49, in Claim 38, after "the" insert -- at --.

Signed and Sealed this

Fifteenth Day of April, 2008

JON W. DUDAS
*Director of the United States Patent and Trademark Office*